(12) United States Patent
Yoo

(10) Patent No.: US 10,529,852 B2
(45) Date of Patent: Jan. 7, 2020

(54) FERROELECTRIC MEMORY DEVICE AND METHOD OF MANUFACTURING THE SAME

(71) Applicant: SK hynix Inc., Icheon-si (KR)

(72) Inventor: Hyangkeun Yoo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/004,309

(22) Filed: Jun. 8, 2018

(65) Prior Publication Data

US 2019/0131458 A1 May 2, 2019

(30) Foreign Application Priority Data

Oct. 31, 2017 (KR) ........................ 10-2017-0143796

(51) Int. Cl.
| | | |
|---|---|---|
| H01L 29/78 | (2006.01) | |
| H01L 29/51 | (2006.01) | |
| H01L 29/66 | (2006.01) | |
| H01L 21/28 | (2006.01) | |
| H01L 27/1159 | (2017.01) | |
| H01L 45/00 | (2006.01) | |

(52) U.S. Cl.
CPC .... *H01L 29/78391* (2014.09); *H01L 27/1159* (2013.01); *H01L 29/40111* (2019.08); *H01L 29/516* (2013.01); *H01L 29/6684* (2013.01); *H01L 45/04* (2013.01); *H01L 45/06* (2013.01); *H01L 45/124* (2013.01); *H01L 45/142* (2013.01); *H01L 45/143* (2013.01); *H01L 45/144* (2013.01); *H01L 45/146* (2013.01); *H01L 45/147* (2013.01)

(58) Field of Classification Search
CPC ............. H01L 29/78391; H01L 29/516; H01L 21/28291; H01L 27/1159; H01L 29/6684
USPC .......................................................... 257/295
See application file for complete search history.

(56) References Cited

U.S. PATENT DOCUMENTS

| | | | |
|---|---|---|---|
| 6,080,235 A | 6/2000 | McKee et al. | |
| 6,831,313 B2 | 12/2004 | Uchiyama et al. | |
| 2006/0081901 A1* | 4/2006 | Arimoto | G11C 11/22 257/295 |

* cited by examiner

*Primary Examiner* — Caleen O Sullivan

(57) ABSTRACT

A ferroelectric memory device according to an embodiment of the present disclosure includes a substrate, a ferroelectric material layer disposed on the substrate, a gate electrode layer disposed on the ferroelectric material layer, and a polarization switching seed layer disposed between the ferroelectric material layer and the gate electrode layer.

14 Claims, 30 Drawing Sheets

FERROELECTRIC MEMORY DEVICE AND METHOD OF MANUFACTURING THE SAME

CROSS-REFERENCE TO RELATED APPLICATION

The present application claims priority under 35 U.S.C. 119(a) to Korean Patent Application No. 10-2017-0143796, filed on Oct. 31, 2017, which is herein incorporated by reference in its entirety.

BACKGROUND

1. Technical Field

Various embodiments of the present disclosure generally relate to a ferroelectric memory device and a method of manufacturing the same.

2. Related Art

Generally, a ferroelectric material refers to a material having spontaneous electrical polarization in a state in which no external electric field is applied. More specifically, the ferroelectric material can maintain one of two stable remanent polarization states. Such property may be utilized to store information "0" or "1" in a nonvolatile manner.

Recently, a ferroelectric memory device in a form of a field effect transistor in which a ferroelectric material is used in a gate dielectric layer has been studied. A write operation of the memory device may be performed by applying a predetermined write voltage to a gate electrode layer and recording different remanent polarization states on the gate dielectric layer as logic information. A read operation of the memory device may be performed by reading an operating current passing through a channel layer of the field effect transistor, in which a channel resistance of the field effect transistor can change according to different remanent polarization states recorded in the gate dielectric layer.

SUMMARY

There is provided a ferroelectric memory device according to one aspect of the present disclosure. The ferroelectric memory device includes a substrate, a ferroelectric material layer disposed on the substrate, a gate electrode layer disposed on the ferroelectric material layer, and a polarization switching seed layer disposed between the ferroelectric material layer and the gate electrode layer.

There is provided a ferroelectric memory device according to another aspect of the present disclosure. The ferroelectric memory device includes a substrate including a channel structure having a bottom surface and side surfaces, a ferroelectric material layer disposed on the bottom surface and the side surfaces of the channel structure, a polarization switching seed layer pattern and an insulating layer pattern that are alternately stacked on the ferroelectric material layer on the side surfaces, and a gate electrode layer electrically connected to the polarization switching seed layer pattern in the channel structure.

There is provided a method of manufacturing a ferroelectric memory device according to another aspect of the present disclosure. In the method of manufacturing a ferroelectric memory device, a substrate including a channel structure having a bottom surface and side surfaces is prepared. A ferroelectric material layer is formed on the bottom surface and the side surfaces of the channel structure. A polarization switching seed film and an insulating thin film are alternately stacked along a direction perpendicular to the bottom surface of the channel structure, on the ferroelectric material layer on the bottom surface of the channel structure. The polarization switching seed film and the insulating thin film are patterned along the direction perpendicular to the bottom surface of the channel structure to form a polarization switching seed layer pattern and an insulating layer pattern that are alternately stacked on the ferroelectric material layer along the side surfaces of the channel structure. A gate electrode layer disposed on the polarization switching seed layer pattern and insulating layer pattern is formed.

DETAILED DESCRIPTION

Figure 1:
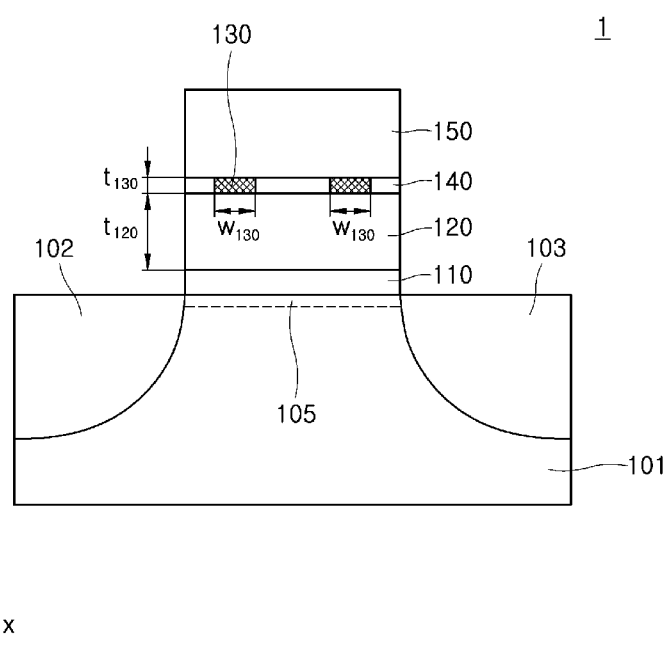
FIG. 1 is a cross-sectional view schematically illustrating a ferroelectric memory device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a part, or combinations thereof, but not used to preclude the presence or possibility of addition one or more other features, numbers, steps, operations, components, parts, or combinations thereof. Further, in performing a method or a manufacturing method, each process constituting the method can take place differently from the stipulated order unless a specific sequence is described explicitly in the context. In other words, each process may be performed in the same manner as stated order, may be performed substantially at the same time, or may be performed in a reverse order.

FIG. 1 is a cross-sectional view schematically illustrating a ferroelectric memory device 1 according to an embodiment of the present disclosure.

Referring to FIG. 1, the ferroelectric memory device 1 may include a substrate 101, a ferroelectric material layer 120, polarization switching seed layer 130 and a gate electrode layer 150. In addition, the ferroelectric memory device 1 may further include an interfacial insulating layer 110 disposed between the substrate 101 and the ferroelectric material layer 120. The ferroelectric memory device 1 may be a transistor-typed device having different channel resistances depending on an orientation of a remanent polarization stored in the ferroelectric material layer 120.

The ferroelectric memory device 1 may perform the following memory operation. Regarding a write operation, a predetermined write voltage applied through the gate electrode layer 150, may determine the orientation of polarization formed in the ferroelectric material layer 120. A remanent polarization of the same orientation as the polarization orientation can be stored in the ferroelectric layer 120 even after the write voltage is removed.

The stored remanent polarization may implement different signal information depending on different polarization orientations. As an example, a remanent polarization oriented from the gate electrode layer 150 toward the substrate 101 may store signal information of "0", and a remanent polarization oriented from the substrate 101 toward the gate electrode layer 150 may store signal information of "1".

Meanwhile, the remanent polarization may induce charges such as electrons or holes into a channel region 105 of the substrate 101. Regarding a read operation, when a predetermined read voltage is applied to the gate electrode layer 150, a channel resistance between a source region 102 and a drain region 103 may be determined depending on, for example, a type and quantity of the charges induced in the channel region 105 by the stored remanent polarization. As an example, when information of "0" is stored, electrons may be induced in or moved toward the channel region 105 in response to the corresponding remanent polarization, so that the channel resistance may be lowered or reduced to a predetermined value or level during the read operation. In addition, when information of "1" is stored, electrons may be removed or repelled from the channel region 105 in response to the corresponding remanent polarization, so that the channel resistance may be raised or increased to a predetermined value or level during the read operation. At this time, logic information stored in the ferroelectric memory device 1 can be read by measuring the change, if any, in the channel resistance resulting from application of a read voltage.

The substrate 101 may, for example, include a semiconductor material. The substrate 101 may, for example, be a silicon (Si) substrate, a gallium arsenide (GaAs) substrate, an indium phosphide (InP) substrate, a germanium (Ge) substrate, or a silicon germanium (SiGe) substrate. In an embodiment, the substrate 101 may be doped to have conductivity. As an example, the substrate 101 may be doped with a p-type dopant.

The source region 102 and the drain region 103 may be disposed in the substrate 101 at both ends of the channel region 105. In an embodiment, the source region 102 and the drain region 103 may be regions of the substrate 101 that exhibit a predetermined conductivity by dopant implantation. In an embodiment, the source region 102 and the drain region 103 may be regions doped with an n-type dopant in the substrate 101.

The interfacial insulation layer 110 may be disposed on the substrate 101. The interfacial insulation layer 110 may be disposed between the substrate 101 and the ferroelectric material layer 120 to suppress the diffusion of materials between the substrate 101 and the ferroelectric material layer 120. In addition, the interfacial insulation layer 110 can prevent direct contact between the substrate 101 and the ferroelectric material layer 120 when the substrate 101 and the ferroelectric material layer 120 have crystal lattices of different sizes. The interfacial insulation layer 110 can suppress crystal defects due to the strain generated at an interface between the substrate 101 and the ferroelectric material layer 120. The strain may be generated by the crystal lattice difference.

The interfacial insulation layer 110 may, for example, include silicon oxide, silicon nitride, silicon oxynitride, or aluminum oxide. As an example, when the substrate 101 is a silicon substrate, the interfacial insulation layer 110 may be a silicon oxide layer, a silicon nitride layer, or a silicon oxynitride layer.

The ferroelectric material layer 120 may be disposed on the interfacial insulation layer 110. The ferroelectric material layer 120 may include a ferroelectric material that can store a remanent polarization. The ferroelectric material layer 120 may have a thickness $t_{120}$ of, for example, about five (5) nanometers (nm) to about fifteen (15) nm.

In an embodiment, the ferroelectric material layer 120 may include a crystalline metal oxide. The ferroelectric material layer 120 may, for example, include hafnium oxide, zirconium oxide, or hafnium zirconium oxide, $Pb(Zr,Ti)O_3$, $SrBi_2Ta_2O_9$ $(Bi,La)_4Ti_3O_{12}$, $BiFeO_3$, or a combination of two or more thereof.

In an embodiment, the ferroelectric material layer 120 may include at least one dopant. The dopant distributed in the ferroelectric material layer 120 may serve to stabilize the ferroelectricity of the ferroelectric material layer 120. When the ferroelectric material layer 120 includes binary metal oxide, the ferroelectric material layer 120 may include a dopant having a valence value of 2 to 4. As an example, the ferroelectric material layer 120 may include carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof.

The polarization switching seed layer 130 may be disposed on the ferroelectric material layer 120. The polarization switching seed layer 130 may be a layer pattern having a predetermined cross-sectional area. The polarization switching seed layer 130 may function as seeds for switching the polarization of the ferroelectric material layer 120. The polarization switching seed layer 130 need not cover the entire surface of ferroelectric material layer 120, and may be disposed in contact with a portion of the ferroelectric material layer 120. In FIG. 1, referring to the xyz axis therein, the polarization switching seed layer 130 may have a thickness $t_{130}$ in a z direction, and have a width and a length measured or located on a plane made up of an x direction (width) and a y direction (length). As an example, the polarization switching seed layer 130 may have the thickness $t_{130}$ of about one (1) nm to about two (2) nm and a width $w_{130}$ measured along the x direction. The polarization switching seed layer 130 may also have a length (not illustrated) that has predetermined sizes or values within a range of two (2) nm to ten (10) nm.

The polarization switching seed layer 130 may include a conductive material. The polarization switching seed layer 130 may, for example, include tungsten (W), titanium (Ti), copper (Cu), aluminum (Al), platinum (Pt), iridium (Ir), ruthenium (Ru), tungsten nitride, titanium nitride, tantalum nitride, iridium oxide, ruthenium oxide, tungsten carbide, titanium carbide, tungsten silicide, titanium silicide, tantalum silicide, or a combination of two or more thereof.

Referring again to FIG. 1, an insulation layer 140 may be disposed between the polarization switching seed layer 130 on the ferroelectric material layer 120. The insulation layer 140 may serve to electrically isolate the polarization switching seed layer 130 in a lateral direction, or in the x-y directions. The insulation layer 140 may, for example, include silicon oxide, silicon nitride, silicon oxynitride, aluminum nitride, aluminum oxide, or a combination of two or more thereof. In an embodiment, an upper surface of the insulation layer 140 may be located on substantially the same plane as an upper surface of the polarization switching seed layer 130. The insulation layer 140 and the polarization switching seed layer 130 may have the same thickness, and may have one or more coplanar surfaces.

The gate electrode layer 150 may be disposed on the polarization switching seed layer 130 and the insulation layer 140. The gate electrode layer 150 may be electrically connected to the polarization switching seed layer 130. Accordingly, an external bias or voltage applied to the gate electrode layer 150 may be transmitted or passed through to the ferroelectric material layer 120 through the polarization switching seed layer 130, in which the polarization switching seed layer has predetermined or known cross-sectional areas.

The gate electrode layer 150 may include a conductive material. The gate electrode layer 150 may, for example, include tungsten (W), titanium (Ti), copper (Cu), aluminum (Al), platinum (Pt), iridium (Ir), ruthenium (Ru), tungsten nitride, titanium nitride, tantalum nitride, iridium oxide, ruthenium oxide, tungsten carbide, titanium carbide, tungsten silicide, titanium silicide, tantalum silicide, or a combination of two or more thereof. The gate electrode layer 150 may include the same conductive material as the polarization switching seed layer 130. Alternatively, the gate electrode layer 150 may be different or include different conductive material from the polarization switching seed layer 130.

According to an embodiment of the present disclosure, an electric field formed on the ferroelectric material layer 120 depending on an application of the external bias can be controlled by the polarization switching seed layer 130 on the ferroelectric material layer 120. As an example, the polarization switching seed layer 130 may be a layer pattern in contact with a portion of the ferroelectric material layer 120, so that an applied electric field is more concentrated on a region of the ferroelectric material layer 120 in contact with the layer pattern, as opposed to regions of the ferroelectric material layer 120 in contact with insulation layer 140. Accordingly, as will be described later, nucleation of a ferroelectric domain having a newly oriented polarization direction can be effectively induced in a region of the ferroelectric material layer 120 where the electric field is concentrated. A polarization switching operation in the ferroelectric material layer 120 can proceed from the nuclei induced in the ferroelectric domain, which can uniformly grow in the ferroelectric material layer 120.

According to an embodiment of the present disclosure, the nucleation operation of the ferroelectric domain generated in the ferroelectric material layer 120 can be effectively controlled by, for example, managing the cross-sectional area and distribution of the polarization switching seed layer 130. As a result, the reliability of the polarization switching operation of the ferroelectric material layer 120 can be improved by improving control of the nucleation initiation sites when a write operation to the ferroelectric memory device 1 is performed.

FIGS. 2A to 2E are views schematically illustrating a polarization switching operation of a ferroelectric memory device according to an embodiment of the present disclosure. The ferroelectric memory device illustrated in FIGS. 2A to 2E may be substantially the same in configuration as the ferroelectric memory device 1 described above and with reference to FIG. 1.

A remanent polarization may be stored in the ferroelectric material layer 120 as signal information. The remanent polarization may have a first polarization orientation $P_{up}$ directed from the substrate 101 toward the gate electrode layer 150, that is, of an upward direction, or may have a second polarization direction $P_{dn}$ directed from the gate electrode layer 150 toward the substrate 101, that is, of a downward direction.

Figure 2A:
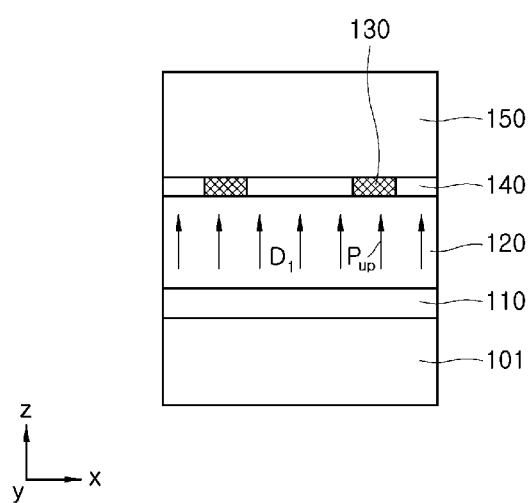
FIGS. 2A to 2E are views schematically illustrating a polarization switching operation of a ferroelectric memory device according to an embodiment of the present disclosure.

A polarization region that has polarizations of the same polarization orientation in the ferroelectric material layer 120 may constitute a single ferroelectric domain. As an example, as illustrated in FIG. 2A, when the entire ferroelectric material layer 120 includes a first remanent polarization having a first polarization orientation $P_{up}$, the ferroelectric material layer 120 may be represented as consisting of a single ferroelectric domain $D_1$. At this time, due to the formation of the first remanent polarization having the first polarization orientation $P_{up}$, negative charges may be distributed or collected in an inner region of the ferroelectric material layer 120 that is near or interfaces with the interfacial insulation layer 110, and positive charges may be distributed or collected in an inner region of the ferroelectric material layer 120 that is near or interfaces with the polarization switching seed layer 130 and the insulation layer 140. Meanwhile, as illustrated in FIG. 2A, the ferroelectric domain $D_1$ of the ferroelectric material layer 120 may be implemented by applying a sufficient negative bias to the gate electrode layer 150 to perform polarization switching so that the entire polarization of the ferroelectric material layer 120 has the first polarization orientation $P_{up}$.

Figure 2B:
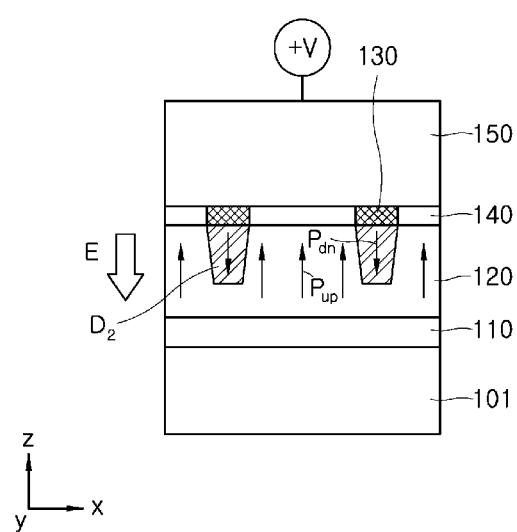

Referring to FIG. 2B, a write voltage +V having a positive bias may be applied to the gate electrode layer 150. At this time, the substrate 101 may be grounded or maintain a relatively low potential as compared with a potential of the gate electrode layer 150. The write voltage +V may be provided to or directed towards the ferroelectric material layer 120 through the polarization switching seed layer 130 having predetermined or controlled cross-sectional areas and thicknesses, and an electric field E may be formed in the ferroelectric material layer 120.

The electric field E may be concentrated on regions of the ferroelectric material layer 120 in contact with the polarization switching seed layer 130, so that a new ferroelectric domain $D_2$ having the second polarization orientation $P_{dn}$ may be nucleated in one or more portions of the ferroelectric material layer 120 in which the electric field E is concentrated. As such, the polarization switching seed layer 130 can control the initiation of nucleation of the ferroelectric domain $D_2$ having the second polarization orientation $P_{dn}$.

Figure 2C:
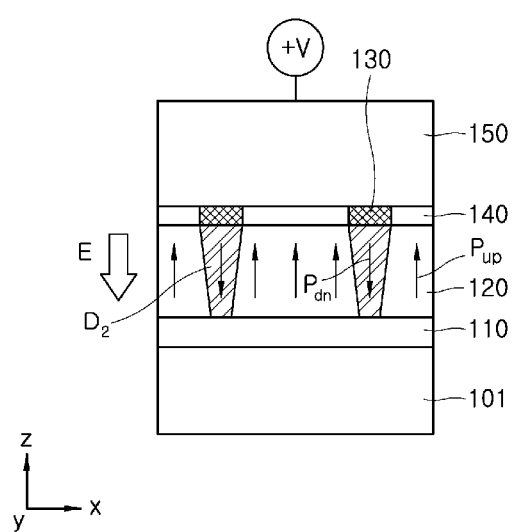

Referring to FIG. 2C, the nucleated ferroelectric domain $D_2$ may grow along the electric field in a direction parallel to a vertical direction, that is, the z direction. Thus, the ferroelectric domain $D_2$ nucleated in regions where the polarization switching seed layer 130 and the ferroelectric material layer 120 are in contact can grow towards an interface between the ferroelectric material layer 120 and the interfacial insulation layer 110. As the ferroelectric domain $D_2$ grows along the z direction, the polarization in the ferroelectric material layer 120 can be switched from the first polarization orientation $P_{up}$ to the second polarization orientation $P_{dn}$.

Figure 2D:
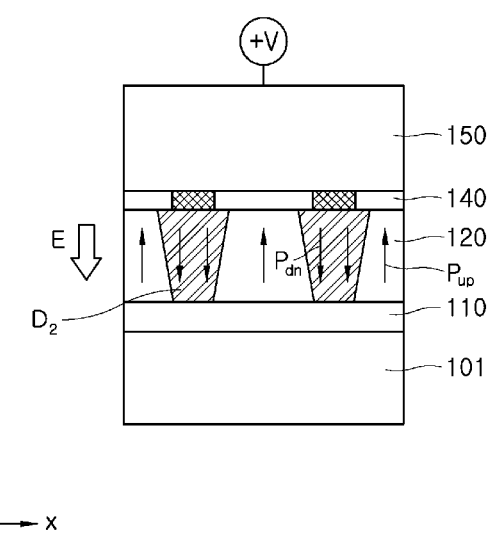

Referring to FIG. 2D, after the ferroelectric domain $D_2$ reaches the interface between the ferroelectric material layer 120 and the interfacial insulation layer 110, the ferroelectric domain D2 can grow in laterally, that is, in directions parallel to the x direction and the y direction. As the ferroelectric domain $D_2$ grows in the x and y directions, the polarization in the ferroelectric material layer 120 can be switched from the first polarization orientation $P_{up}$ to the second polarization orientation $P_{dn}$. Of course, growth of the ferroelectric domain $D_2$ in lateral directions may also occur alongside growth in the z direction, i.e., growth in all directions may occur simultaneously.

Figure 2E:
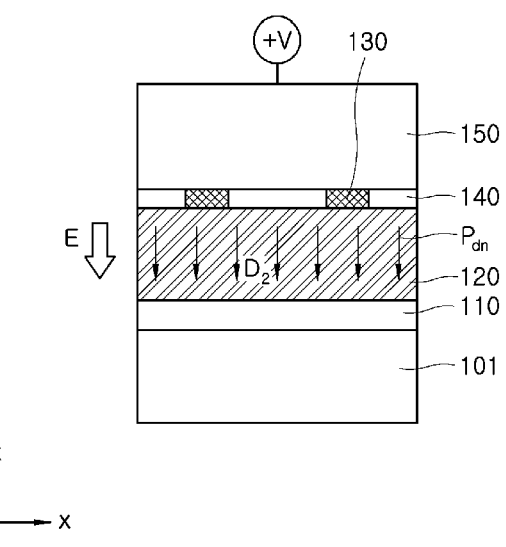

Referring to FIG. 2E, as the growth of the ferroelectric domain $D_2$ through ferroelectric material layer 120 is completed, the polarization of the ferroelectric material layer 120 can be switched to the second polarization orientation $P_{dn}$ over the entire region of the ferroelectric material layer 120. The polarization having the second polarization orientation $P_{dn}$ is stored as a second remanent polarization in ferroelectric material layer 120 after the write voltage is removed. Thus, the write operation to the ferroelectric memory device 1 can be completed.

As described above, according to an embodiment of the present disclosure, the ferroelectric memory device 1 may have a polarization switching seed layer 130 between the ferroelectric material layer 120 and the gate electrode layer 150. When the write voltage having positive bias or negative bias is applied to the gate electrode layer 150, the polarization switching seed layer 130 can induce the nucleation of the ferroelectric domain having the polarization orientation opposite to an existing orientation in ferroelectric material layer 120.

Meanwhile, according to an embodiment of the present disclosure, the physical geometry and distribution of the polarization switching seed layer 130 can be controlled, managed or designed. More specifically, the thickness of the polarization switching seed layer 130, the length and width, and the spacing between the polarization switching seed layer 130 can be determined or designed based on the nucleation rate of a new ferroelectric domain induced by the polarization switching seed layer 130, the growth rate of the new ferroelectric domain $D_2$, the uniformity of the finally grown ferroelectric domain $D_2$, or the like.

Consequently, according to an embodiment of the present disclosure, the nucleation behavior in a ferroelectric material layer having the polarizations in the opposite directions can be effectively controlled by controlling the thickness, cross-sectional area, or distribution of the polarization switching seed layer 130. The polarization switching operation in the ferroelectric material layer may be performed by applying an external electric field to the ferroelectric memory device 1 and growing the nucleated ferroelectric domain in the ferroelectric material layer from the polarization switching seed layer 130. Consequently, the embodiment of the present disclosure improves the reliability of the polarization switching operation in the ferroelectric material layer 120 by effectively controlling the nucleation behavior in the ferroelectric domain.

Figure 3:
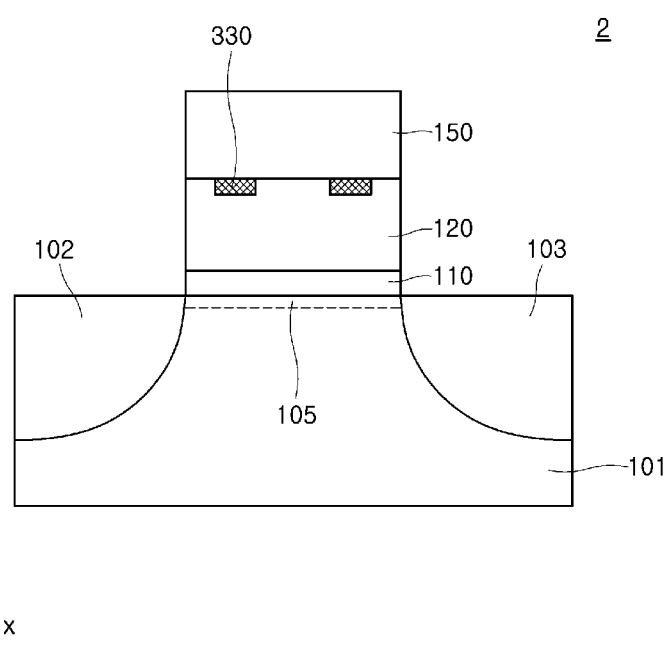
FIG. 3 is a cross-sectional view schematically illustrating a ferroelectric memory device according to another embodiment of the present disclosure.

FIG. 3 is a cross-sectional view schematically illustrating a ferroelectric memory device 2 according to another embodiment of the present disclosure. In FIG. 3, the ferroelectric memory device 2 may be substantially the same in configuration as the ferroelectric memory device 1 described above and with reference to FIG. 1 except that a polarization switching seed layer 330 is embedded in a ferroelectric material layer 120.

Referring to FIG. 3, the polarization switching seed layer 330 may protrude or extend from an interface with a gate electrode layer 150 into or towards the ferroelectric material layer 120 so that the polarization switching seed layer 330 may be embedded or disposed in the ferroelectric material layer 120. As a result, an electric field can be effectively concentrated on an interface between the polarization switching seed layer 330 and the ferroelectric material layer 120 when a write voltage is applied. Nucleation of a new ferroelectric domain in the ferroelectric material layer 120 may occur in regions of ferroelectric material layer 120 in which the electric field concentrates, namely, regions in contact with the polarization switching seed layer 130. Consequently, the nucleation behavior of the ferroelectric domain can be effectively controlled, designed or managed.

Figure 4:
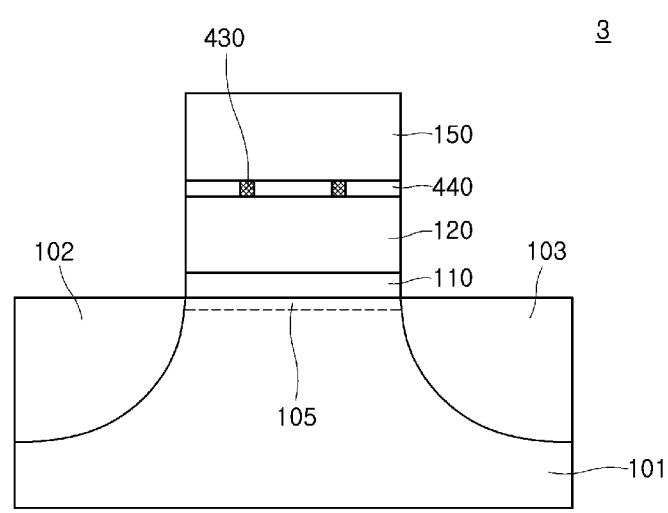
FIG. 4 is a cross-sectional view schematically illustrating a ferroelectric memory device according to yet another embodiment of the present disclosure.

FIG. 4 is a cross-sectional view schematically illustrating a ferroelectric memory device 3 according to yet another embodiment of the present disclosure.

Referring to FIG. 4, the ferroelectric memory device 3 may include a resistance change material layer 440 including conductive filaments 430, as compared with the polarization switching seed layer 130 and insulation layer 140 in the ferroelectric memory device 1 described above and with reference to FIG. 1. The resistance change material layer 440 may include a material that is used in a memory layer in a known resistive random access memory (RRAM). The conductive filaments 430 may be formed in the resistance change material layer 440 by performing a known forming operation to the memory layer of the RRAM.

In the ferroelectric memory device 3 of this embodiment, the resistance change material layer 440 including the reversibly formed conductive filaments 430 may function as the polarization switching seed layer similar to the polarization switching seed layer 130 and insulation layer 140 in ferroelectric memory device 1. When the resistance change material layer 440 is first formed on the ferroelectric material layer 120, the resistance change material layer 440 may not yet have formed conductive filaments 430 and the resistance change material layer 440 may be electrically insulating. When a forming voltage is applied to the resistance change material layer 440 to perform a forming operation, ions, metals, or defects in the resistance change material layer 440 are moved and collected in response to an electric field formed by the forming voltage, and the conductive filaments 430 that pass through the thickness of the resistance change material layer 440 may be formed in portions of the resistance change material layer 440. When the conductive filaments 430 are formed through the resistance change material layer 440, electrons can be conducted through the conductive filaments 430 so that the resistance change material layer 440 may have an electrical conductivity. The conductive filaments 430 may be retained after the forming voltage is removed. The conductive filaments 430 may, for example, have a diameter of about two (2) nm to about ten (10) nm.

The resistance change material layer 440 may, as an example, include titanium oxide, aluminum oxide, nickel oxide, copper oxide, zirconium oxide, manganese oxide, hafnium oxide, tungsten oxide, tantalum oxide, niobium oxide, iron oxide, or a combination of two or more thereof. The resistance change material layer 440 may, as another example, include PCMO($P_{r1-x}Ca_xMnO_3$, 0<x<1), LCMO ($La_{1-x}Ca_xMnO_3$, 0<x<1), BSCFO($Ba_{0.5}Sr_{0.5}Co_{0.8}Fe_{0.2}O_{3-\delta}$), YBCO($YB_{a2}Cu_3O_{7-x}$, 0<x<1), chromium-doped or niobium-doped $(Ba,Sr)TiO_3$, chromium-doped or vanadium-doped $SrZrO_3$, $(La, Sr)MnO_3$, $Sr_{1-x}La_xTiO_3$(0<x<1), $La_{1-x}Sr_xFeO_3$(0<x<1), $La_{1-x}Sr_xCoO_3$(0<x<1), $SrFeO_{2.7}$, $LaCoO_3$, $RuSr_2GdCu_2O_3$, $YBa_2Cu_3O_7$, or a combination of two or more thereof. The resistance change material layer 440 may, as another example, include germanium-antimony-tellurium (GST), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te) $Ge_xSe_{1-x}$(0<x<1), silver sulfide ($Ag_2S$), copper sulfide ($Cu_2S$), cadmium sulfide (CdS), zinc sulfide (ZnS), and selenium oxide ($CeO_2$), or a combination of two or more thereof.

After the conductive filaments 430 are formed, a write voltage applied to the gate electrode layer 150 may be provided to the ferroelectric material layer 120 through the conductive filaments 430. Accordingly, an electric field generated by the write voltage may be concentrated on an upper region of the ferroelectric material layer 120 in contact with the conductive filaments 430. Nucleation of a new ferroelectric domain in the ferroelectric material layer 120 may initiate and occur in a region where the electric filed is concentrated. Subsequently, the nucleated ferroelectric domain may grow along the electric field in the ferroelectric material layer 120.

FIGS. 5A to 5E are cross-sectional views schematically illustrating a polarization switching operation of a ferroelectric memory device according to an embodiment of the present disclosure. The ferroelectric memory device illustrated in FIGS. 5A to 5E may be substantially the same in configuration as the ferroelectric memory device 3 described above with reference to FIG. 4. In other words, the ferroelectric memory device illustrated in FIGS. 5A to 5E may include a resistance change material layer 440 having conductive filaments 430 between a ferroelectric material layer 120 and a gate electrode layer 150.

Figure 5A:
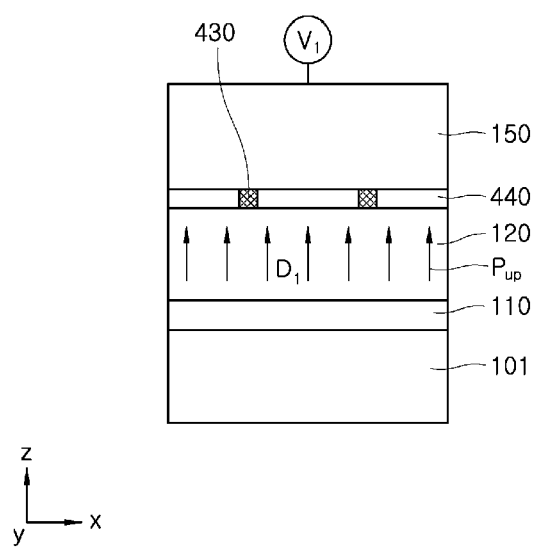
FIGS. 5A to 5E are cross-sectional views schematically illustrating a polarization switching operation of a ferroelectric memory device according to an embodiment of the present disclosure.

Referring to FIG. 5A, the ferroelectric material layer 120 may, for example, have a ferroelectric domain $D_1$ having a first polarization orientation $P_{up}$. Although it is not shown in FIG. 5A, the ferroelectric domain $D_1$ may be initially implemented by applying a sufficient negative bias to the gate electrode layer 150 and performing polarization switching so that the entire remanent polarization of the ferroelectric material layer 120 has the first polarization orientation $P_{up}$. At this time, due to the remanent polarization having the first polarization orientation $P_{up}$, negative charges may be distributed or collected in an inner region of the ferroelectric layer 120 that is near or interfaces with an interfacial insulation layer 110 and positive charges may be distributed or collected in an inner region of the ferroelectric layer 120 that is near or interfaces with the conductive filaments 430 and the resistance change material layer 440. Meanwhile, as described above, when a predetermined forming voltage $V_1$ is applied between the gate electrode layer 150 and the substrate 101, ions, metals or defects in the resistance change material layer 440 may be moved along an electric field formed by the forming voltage and collected to form the conductive filaments 430. The forming voltage $V_1$ need not be limited to a specific bias polarity as long as the requirement for forming the conductive filaments 430 is satisfied.

Figure 5B:
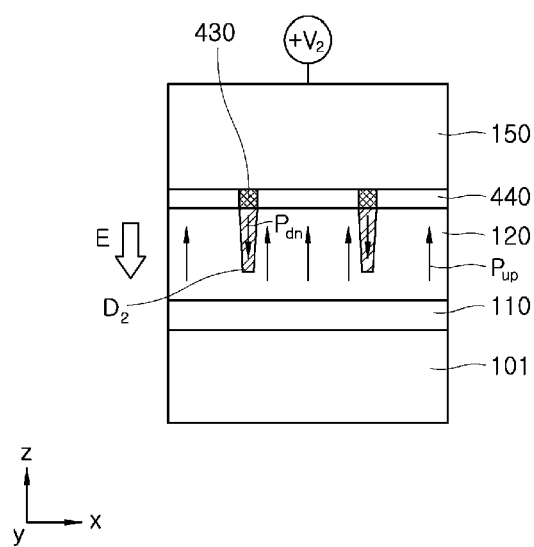

Referring to FIG. 5B, a write voltage $+V_2$ having a positive bias may be applied to the gate electrode layer 150. An electric field formed by the write voltage $+V_2$ may be concentrated, in an upper region of the ferroelectric material layer 120, in contact with the conductive filaments 430. Ferroelectric domain $D_2$ with a second polarization orientation $P_{dn}$ may be nucleated in a region of the ferroelectric material layer 120 in which the electric field is concentrated and may be grow in a direction parallel to the vertical direction, that is, the z direction.

Figure 5C:
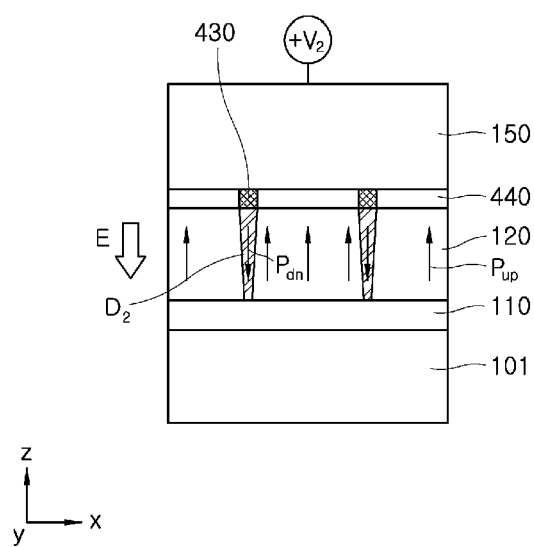
Figure 5D:
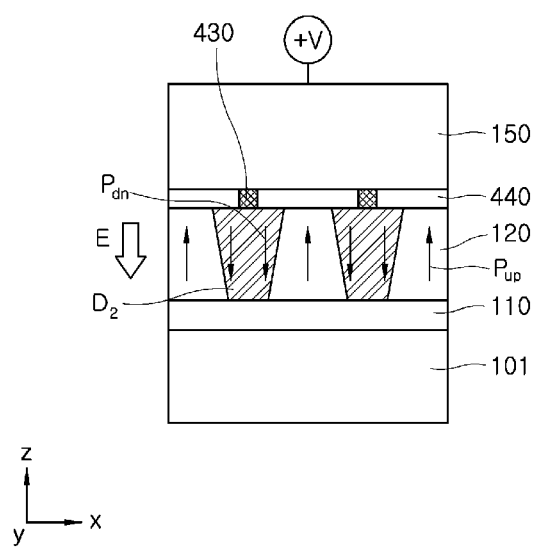

Referring to FIGS. 5C and 5D, after the ferroelectric domain $D_2$ reaches the interface between the ferroelectric material layer 120 and the interfacial insulation layer 110, the ferroelectric domain $D_2$ may grow in laterally, that is, in directions parallel to an x direction or a y direction.

Figure 5E:
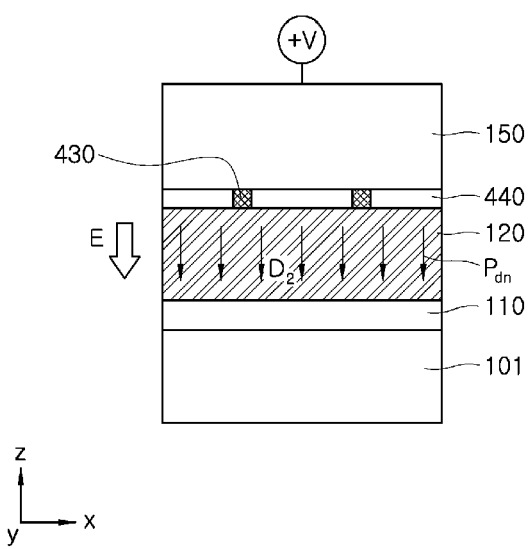

Referring to FIG. 5E, as the growth of the ferroelectric domain $D_2$ is completed, the polarization may be switched to the second polarization orientation $P_{dn}$ over the entire region of the ferroelectric material layer 120. This remanent polarization may be retained in the absence of an applied electric field. Thus, the write operation to the ferroelectric memory device 4 may be completed.

Figure 6A:
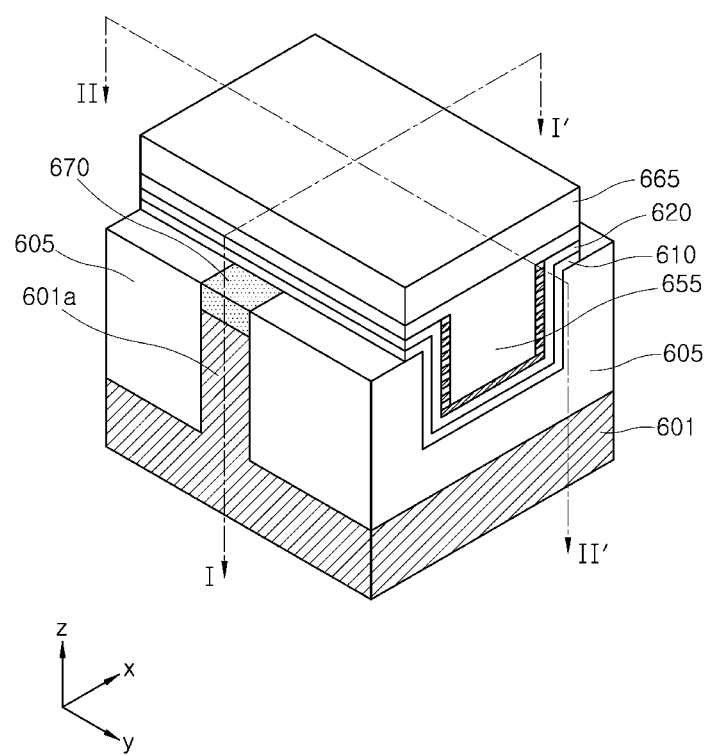
FIGS. 6A to 6C are views schematically illustrating a ferroelectric memory device according to still yet another embodiment of the present disclosure.
Figure 6B:
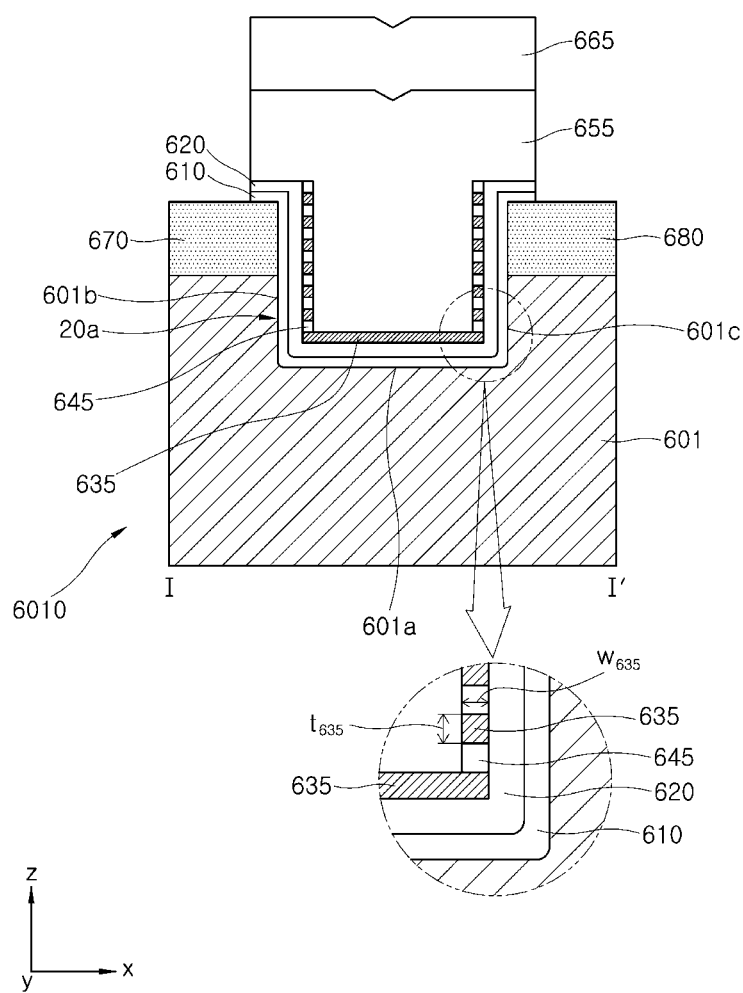
Figure 6C:
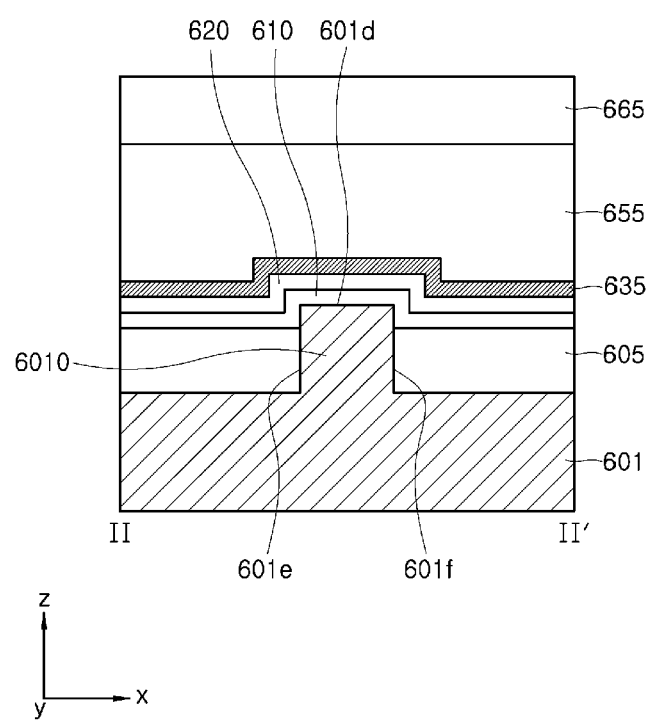

FIGS. 6A to 6C are views schematically illustrating a ferroelectric memory device 4 according to another embodiment of the present disclosure. Specifically, FIG. 6A is a perspective view of the ferroelectric memory device 4, FIG. 6B is a cross-sectional view of the ferroelectric memory device 4 of FIG. 6A taken along line I-I', and FIG. 6C is a cross-sectional view of the ferroelectric memory device 4 of FIG. 6A taken along line II-II'. The ferroelectric memory device 4 illustrated in FIGS. 6A to 6C may be a three-dimensional transistor device having a saddle-typed channel structure. The channel structure may be implemented in a form of a fin structure.

Referring to FIGS. 6A to 6C, a substrate 601 may be provided. A channel structure 6010 may be disposed to protrude upward in the z direction from the substrate 601. The substrate 601 may, for example, have substantially the same configuration as the substrate 101 described above with reference to FIG. 1. In an embodiment, the substrate 601 may be a doped monocrystalline silicon substrate. In an embodiment, the channel structure 6010 may be made of the same material as the substrate 601. In an embodiment, the channel structure 6010 is a portion or an extension of the substrate 601. The channel structure 6010 may extend along an x direction.

Referring to FIGS. 6A and 6C, an interlayer insulation layer 605 surrounding the channel structure 6010 may be disposed on the substrate 601. The interlayer insulation layer 605 may, for example, include silicon oxide, silicon nitride, silicon oxynitride, aluminum nitride, aluminum oxide, or a combination of two or more thereof.

Referring to FIGS. 6A and 6B, the channel structure 6010 may have a bottom surface 601a extending in the x and y directions and side surfaces 601b and 601c extending in the y and z directions. An interfacial insulation layer 610 may be disposed on the bottom surface 601a and side surfaces 601b and 601c of a first trench 20a. A ferroelectric material layer 620 may be disposed on the interfacial insulation layer 610. As illustrated in FIGS. 6B and 6C, the interfacial insulating layer 610 and the ferroelectric material layer 620 may be sequentially disposed with respect to at least a part of the upper surface 601d of the channel structure 6010 and the side surfaces 601e and 601f, and the upper surface of the interlayer insulating layer 605. The configurations of the interfacial insulating layer 610 and the ferroelectric material layer 620 may be substantially the same as those of the interfacial insulating layer 110 and the ferroelectric material layer 120 described above with reference to FIG. 1.

Meanwhile, referring to FIG. 6B, a lowermost layer pattern of the polarization switching seed layer pattern 635 may contact the ferroelectric material layer 620 disposed on the bottom surface 601a of the channel structure 6010. The polarization switching seed layer pattern 635 and an insulation layer pattern 645 may be alternately disposed along the z direction over a portion of the lowermost layer pattern of the polarization switching seed layer pattern 635 common to the sides 601b and 601c of the first trench 20a. In an embodiment, the polarization switching seed layer pattern 635 disposed on the side surfaces 601b and 601c of the channel structure 6010 may have a thickness $t_{635}$ of about two (2) nm to about ten (10) nm and a width $w_{635}$ of about one (1) nm to about two (2) nm. Referring to FIG. 6C, the lowermost layer pattern of the polarization switching seed layer pattern 635 may be disposed on the ferroelectric material layer 620 disposed on the upper surface 601d of the channel structure 6010. Further, the lowermost layer pattern of the polarization switching seed layer pattern 635 may be disposed on the ferroelectric material layer 620 disposed on the interlayer insulation layer 605.

The polarization switching seed layer pattern 635 may have substantially the same configuration as the polarization switching seed layer 130 described above with reference to FIG. 1 and may perform substantially the same function as the polarization switching seed layer 130 with respect to the ferroelectric material layer 620. The insulation layer pattern 645 may include an insulating material. As an example, the insulation layer pattern 645 may include silicon oxide, silicon nitride, silicon oxynitride, aluminum nitride, aluminum oxide, or a combination of two or more thereof.

Referring back to FIG. 6B, a gate electrode layer 655 may be disposed on the polarization switching seed layer pattern 635 and the insulation layer pattern 645 that are disposed on an inner wall surfaces 601a, 601b and 601c of the channel structure 6010. An upper conductive layer 665 may be disposed on the gate electrode layer 655. Referring to FIG. 6C, the gate electrode layer 655 and the upper conductive layer 665 may be disposed sequentially on the polarization switching seed layer pattern 635.

As described above, the polarization switching seed layer pattern 635 of the ferroelectric memory device 4 according to this embodiment of the present disclosure may be disposed in contact with a portion of the ferroelectric material layer 620 disposed on the sidewall surfaces 601b and 601c of the channel structure 6010. When a write voltage is applied through the upper conductive layer 665 and the gate electrode layer 655, nucleation of a ferroelectric domain may occur in a region of the ferroelectric layer 620 in contact with the polarization switching seed layer pattern 635. The nucleation of the ferroelectric domain can be effectively controlled by controlling the size and distribution of the polarization switching seed layer pattern 635. Since the growth of the ferroelectric domain proceeds from the nuclei of the generated ferroelectric domain, the reliability of the polarization switching operation in the ferroelectric layer can be improved.

FIGS. 6A to 6C disclose a transistor structure having the saddle type channel structure as an example of a three-dimensional ferroelectric memory device. Although not illustrated, according to some other embodiments, the configuration of the polarization switching seed layer pattern 635 can be similarly applied to ferroelectric memory devices of the various transistor structure of the trench type or fin type employing the three-dimensional channel structure described above.

FIGS. 7 to 14 are views schematically illustrating a method of manufacturing a ferroelectric memory device according to an embodiment of the present disclosure. The method of manufacturing the ferroelectric memory device may be, as an example, a method of manufacturing the ferroelectric memory device 4 described above with reference to FIGS. 6A to 6C. Specifically, FIGS. 7 to 14 are perspective view for explaining the method, FIGS. 10A, 11A, and 12A are views explaining the method using cross-sectional views taken along a line direction A-A' of FIGS. 10, 11, and 12, respectively. FIGS. 10B, 11B and 12B are views for explaining the method using cross-sectional views taken along a line direction B-B' of FIGS. 10, 11, and 12, respectively.

Figure 7:
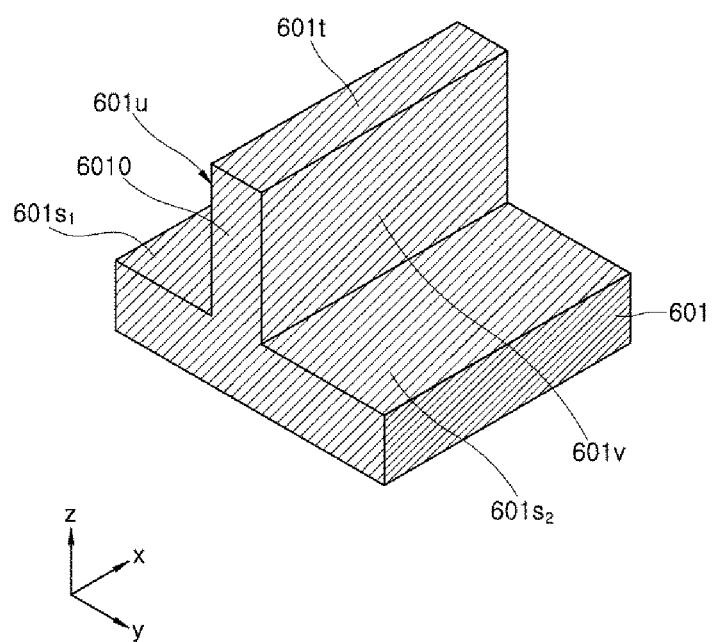
FIGS. 7 to 14 are views schematically illustrating a method of manufacturing a ferroelectric memory device according to an embodiment of the present disclosure.

Referring to FIG. 7, a substrate 601 may be prepared. The substrate 601 may, for example, include a semiconductor material. In an embodiment, the substrate 601 may be a silicon substrate doped with a p-type dopant. Subsequently, the substrate 601 may be selectively anisotropically etched to form a channel structure 6010 protruding above or extending from the substrate 601. After the anisotropic etching, the substrate 601 may have first and second surfaces $601s_1$ and $601s_2$. The channel structure 6010 may have a top surface 601t and both side surfaces 601u and 601v.

Figure 8:
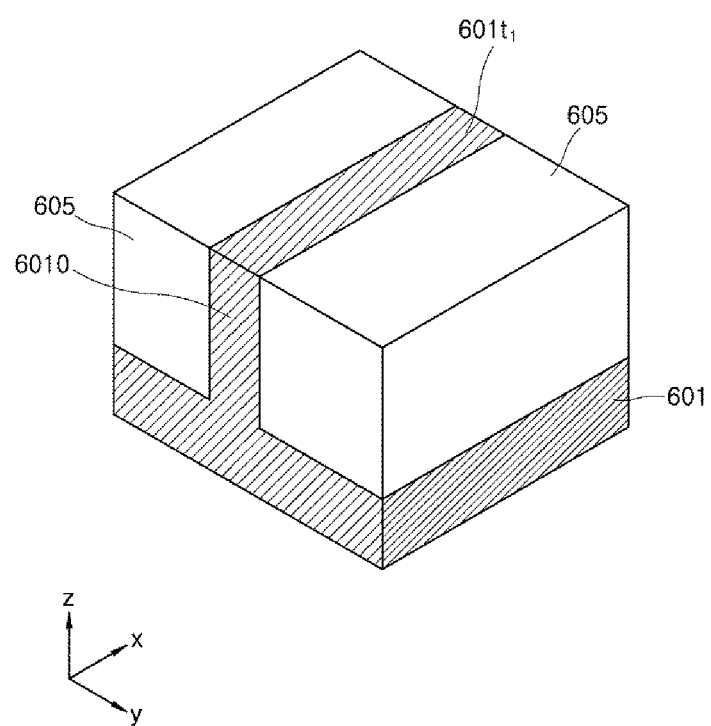

Referring to FIG. 8, an interlayer insulation layer 605 surrounding the channel structure 6010 may be formed on the substrate 601. At this time, the upper surface 601t of the channel structure 6010 and an upper surface of the interlayer insulation layer 605 may be planarized to be coplanar. For example, a chemical vapor deposition process, a coating process, or the like may be employed as a process of forming the interlayer insulation layer 605. Planarization with respect to the channel structure 6010 and the interlayer insulation layer 605 may be performed, for example, using chemical mechanical polishing, etch back or the like.

Figure 9:
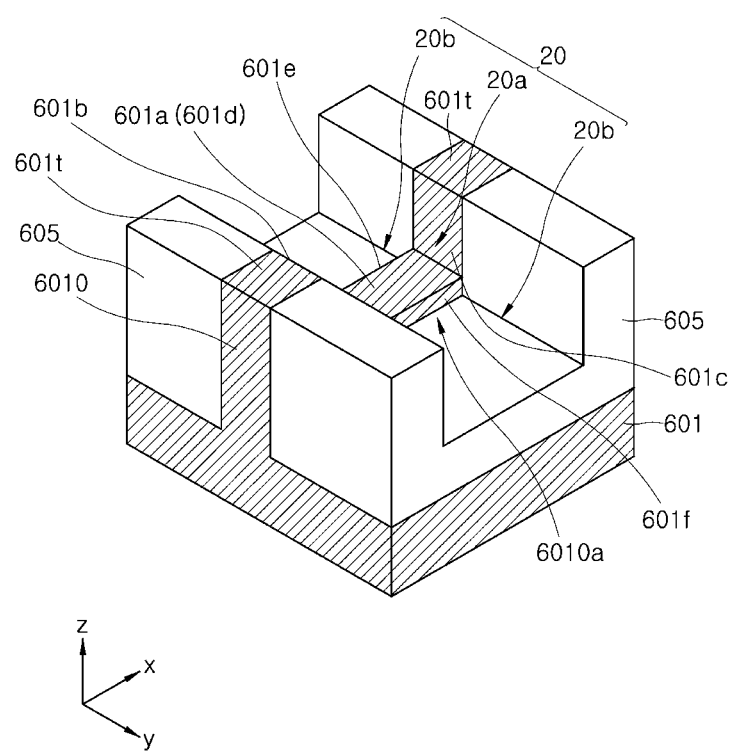

Referring to FIG. 9, the channel structure 6010 and the interlayer insulation layer 605 may be etched to form a trench 20. In a specific embodiment, the channel structure 6010 may be selectively etched to form a first trench 20a, and the interlayer insulating layer 605 may be selectively etched to form a second trench 20b. At this time, an etching amount in a thickness direction (i.e., the z direction) with respect to the interlayer insulating layer 605 may be greater than an etching amount of a thickness direction with respect to the channel structure 6010. As a result, a channel recess region 6010a protruding upward relative to the interlayer insulating layer 605 may be formed in the trench 20.

In the channel recess region 6010a, the channel structure 6010 may have a bottom surface 601a and both side surfaces 601b and 601c of the first trench 20a. The channel structure 6010 may also have an upper surface 601d and both side surfaces 601e and 601f formed by the second trench 20b. As shown, in a structure after the first and second trenches 20a and 20b are formed, the bottom surface 601a of the first trench 20a may be the top surface 601d of channel structure 6010.

Figure 10:
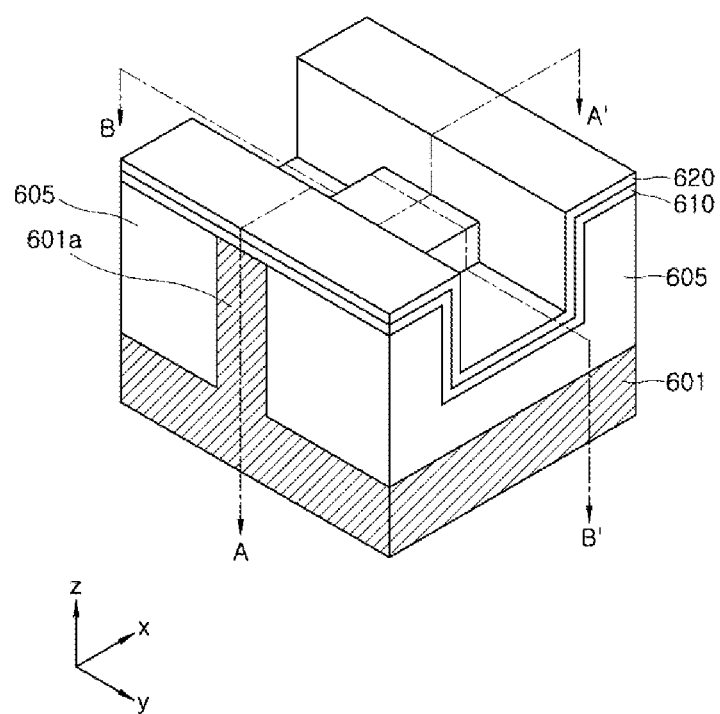
Figure 10A:
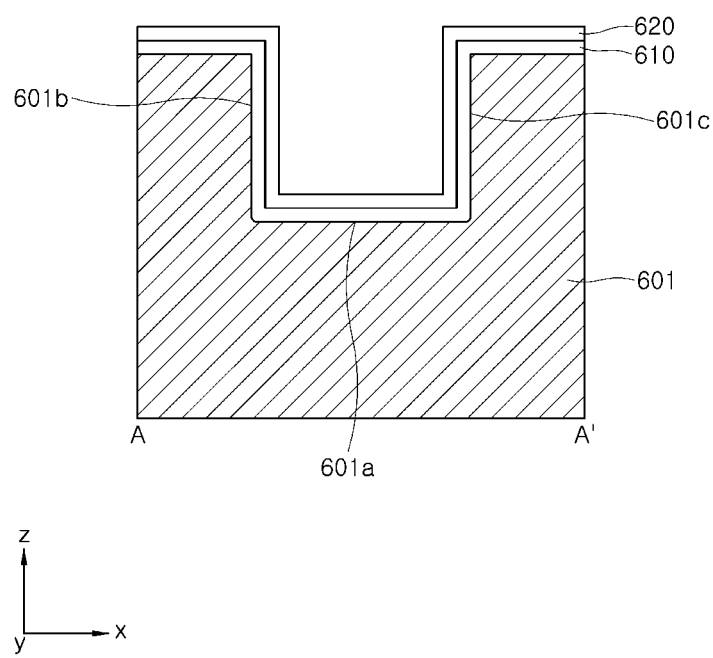
Figure 10B:
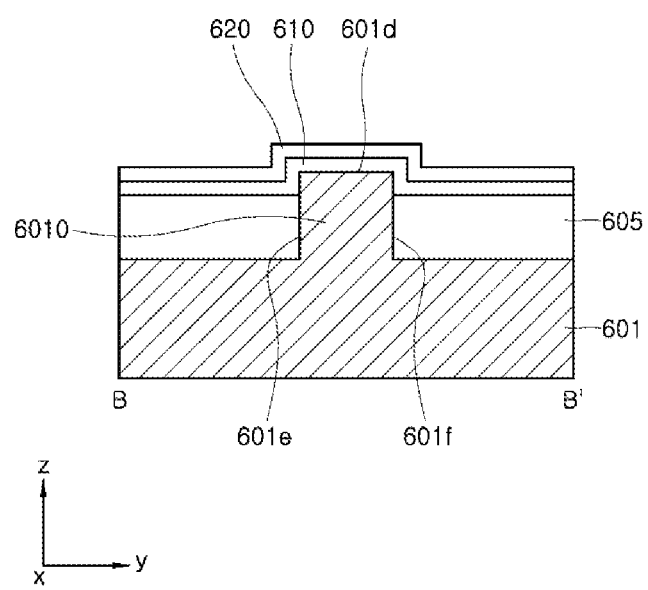

Referring to FIGS. 10 and 10A, an interfacial insulation layer 610 and a ferroelectric material layer 620 may be sequentially formed in the channel recess region 6010a along the inner surfaces 601a, 601b and 601c of the first trench 20a. Referring to FIGS. 10 and 10B, the interfacial insulation layer 610 and the ferroelectric material layer 620 may be sequentially formed on a portion of the upper surface 601d and side surfaces 601e and 601f of the channel recess region 6010a, and on the upper surface of the interlayer insulation layer 605. In an embodiment, the interlayer insulation layer 610 may be formed using chemical vapor deposition or atomic layer deposition. The interlayer insulating layer 610 may, for example, have a thickness equal to five (5) nm or less, but greater than zero (0) nm. In an embodiment, the ferroelectric material layer 620 may be formed in a crystalline state using, for example, chemical vapor deposition or atomic layer deposition. The ferroelectric material layer 620 may be formed to have a thickness of about five (5) nm to about fifteen (15) nm, as an example.

The ferroelectric material layer 620 may include crystalline metal oxide. The ferroelectric material layer 620 may, for example, include hafnium oxide, zirconium oxide, Pb(Zr,Ti)O$_3$, SrBi$_2$Ta$_2$O$_9$ (Bi,La)$_4$Ti$_3$O$_{12}$, BiFeO$_3$ or a combination of two or more thereof.

In an embodiment, the ferroelectric material layer 620 may include at least one dopant. When the ferroelectric material layer 620 include binary metal oxide, the ferroelectric material layer 620 may include a dopant having valence value of two (2) to four (4). As an example, the ferroelectric material layer 620 may include carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Gd), lanthanum (La), or a combination of two of more thereof.

Figure 11:
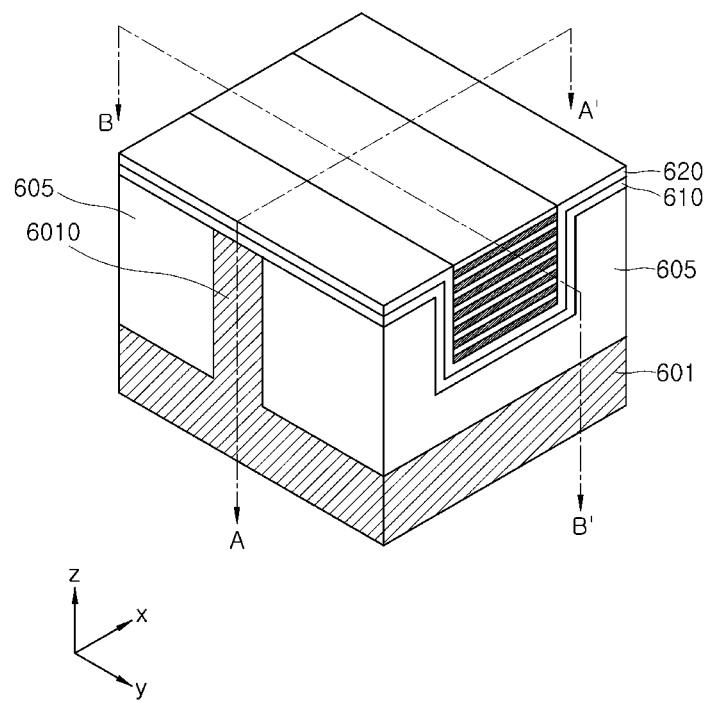
Figure 11A:
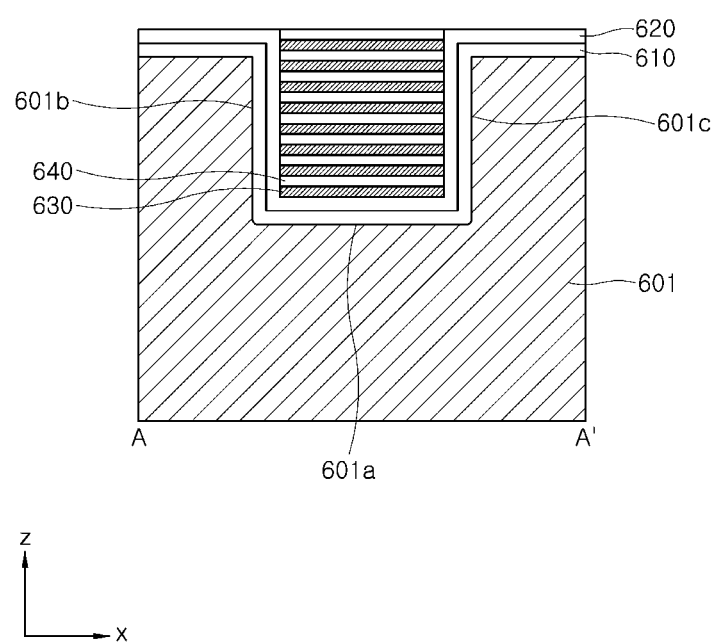
Figure 11B:
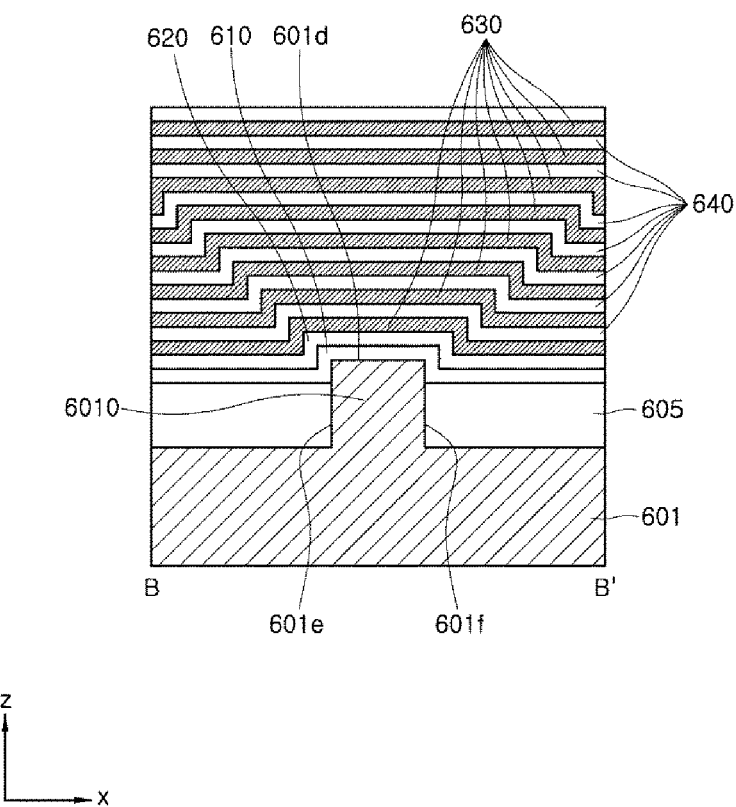

Referring to FIGS. 11 and 11A, a polarization switching seed film 630 and an insulation film 640 may be alternately stacked along a direction perpendicular to the bottom surface 601a on the ferroelectric material layer 620 disposed on the bottom surface 601a of the channel recess region 6010a. At this time, the side surfaces or edges of the polarization switching seed film 630 and the insulation film 640 may be formed to contact the ferroelectric material layer 620 disposed on the side surfaces 601b and 601c of the first trench 20a. Referring to FIGS. 11 and 11B, the polarization switching seed film 630 and the insulation film 640 may be alternately stacked on the ferroelectric material layer 620 disposed on the upper surface 601d and side surfaces 601e and 601f of the channel recess region 6010a and the upper surface of the interlayer insulation layer 605.

The polarization switching seed film 630 may be formed to have a thickness of about two (2) nm to about ten (10) nm. The insulation film 640 may be formed to have a thickness of about two (2) nm to about ten (10) nm. In one embodiment, the thicknesses of the polarization switching seed film 630 and insulation film 640 may be substantially the same.

The polarization switching seed film 630 may, for example, include tungsten (W), titanium (Ti), copper (Cu), aluminum (Al), platinum (Pt), iridium (Ir), ruthenium (Ru), tungsten nitride, titanium nitride, tantalum nitride, iridium oxide, ruthenium oxide, tungsten carbide, titanium carbide, tungsten silicide, titanium silicide, tantalum silicide, or a combination of two or more thereof. The insulation film 640 may, for example, include silicon oxide, silicon nitride, silicon oxynitride, aluminum nitride, aluminum oxide, or a combination of two or more thereof.

The polarization switching seed film 630 and the insulation film 640 may, for example, be formed using a sputtering process, and the process conditions may be controlled so that the deposition direction of the thin film has anisotropy. As an example of the process conditions, a predetermined bias may be additionally applied to the bottom surface of the first trench 20a to act on the particles to increase the mobility of the sputtered particles. As a result, the process conditions may be controlled so that the polarization switching seed film 630 and the insulation film 640 may be stacked along the direction perpendicular to and above the bottom surface 601a of the first trench 20a illustrated in FIG. 11A, and the polarization switching seed film 630 and the insulation film 640 are not be stacked or layered on or over the side surfaces 601b and 601c of the first trench 20a.

Figure 12:
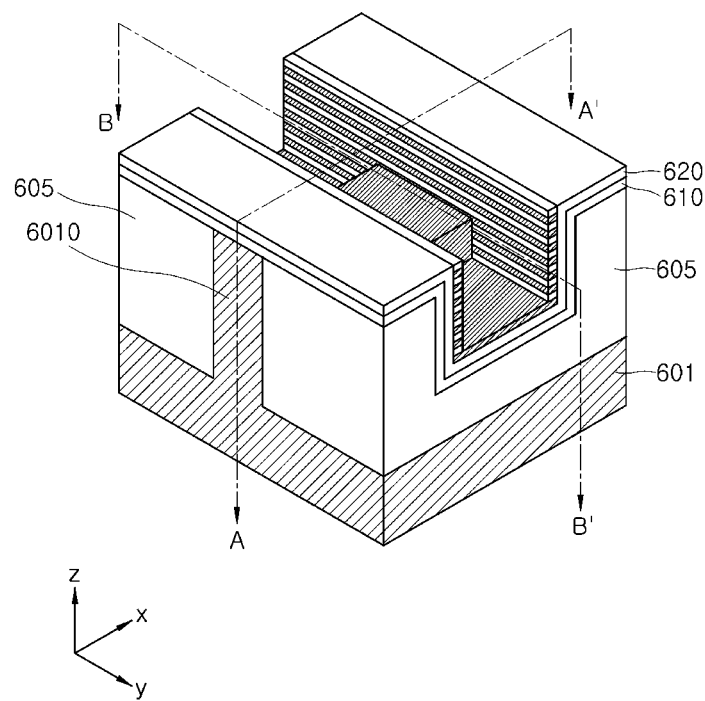
Figure 12A:
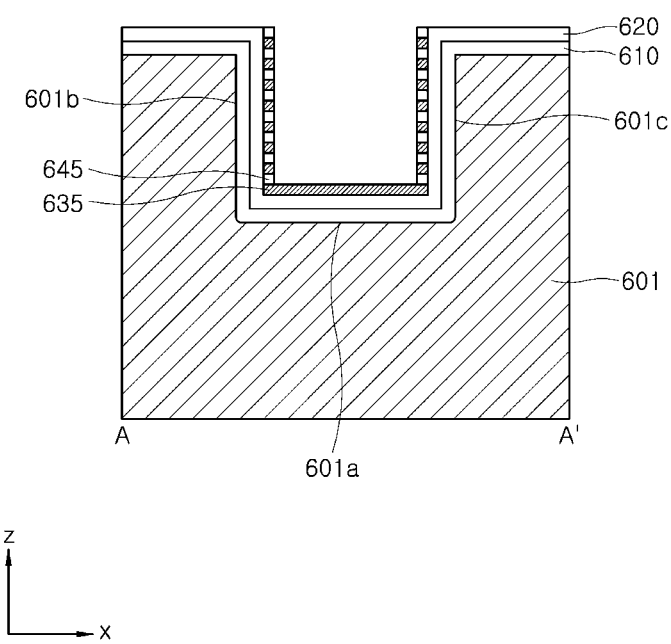
Figure 12B:
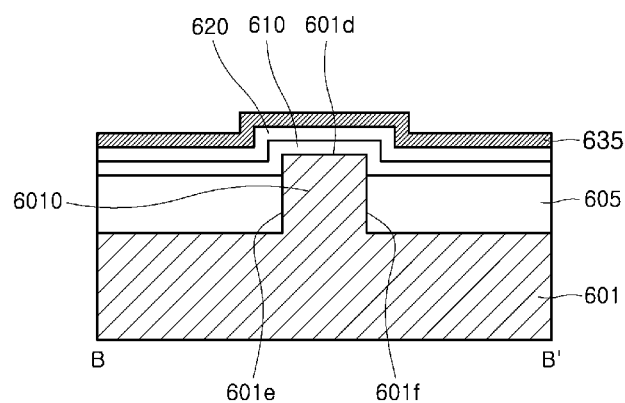

Referring to FIGS. 12, 12A and 12B, the polarization switching seed film 630 and the insulation film 640 may be patterned along the direction perpendicular to the bottom surface 601a of the first trench 20a and the upper surface of the interlayer insulation layer 605. The patterning of the polarization switching seed film 630 and the insulation film 640 may be performed by anisotropic etch process using an etching mask that selectively covers the ferroelectric material layer 620 and insulation film 640 of the structure illustrated in FIGS. 11, 11A. As a result, as illustrated in FIG. 12A, a polarization switching seed layer pattern 635 and an insulation layer pattern 645, which are in contact with the ferroelectric material layer 620 disposed on the side surfaces 601b and 601c of the first trench 20a and alternately stacked in the second direction, that is, the z direction, may be formed. Meanwhile, the lowermost layer pattern of the polarization switching seed layer pattern 635 may be in contact with the ferroelectric material layer 620 disposed on the bottom surface 601a of the first trench 20a.

Referring to FIG. 12B, as a result of the patterning, the polarization switching seed layer pattern 635 in contact with the ferroelectric material layer 620 disposed on the upper surface 201d and side surfaces 201e and 201f of the channel recess region 6010a and the upper surface of the interlayer insulation layer 605 may be formed.

Figure 13:
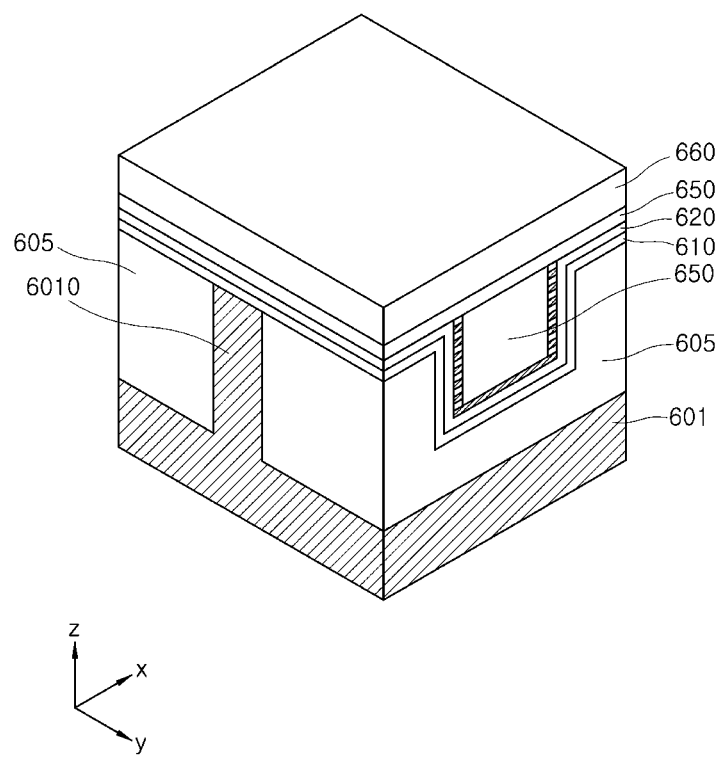

Referring to FIG. 13, a gate electrode layer 650 may be formed in the first trench 20a in which the polarization switching seed layer pattern 635 and the insulation layer pattern 645 are formed. In addition, the gate electrode layer 650 may be formed in the channel recess region 6010 in which the polarization switching seed layer pattern 635 is formed. The gate electrode layer 650 may, for example, include tungsten (W), titanium (Ti), copper (Cu), aluminum (Al), platinum (Pt), iridium (Ir), ruthenium (Ru), tungsten nitride, titanium nitride, tantalum nitride, iridium oxide, ruthenium oxide, tungsten carbide, titanium carbide, tungsten silicide, titanium silicide, tantalum silicide, or a combination of two or more thereof. The gate electrode layer 650 may, as one example, include the same conductive material as the polarization switching seed layer pattern 635. As another example, the gate electrode layer 650 may include a different conductive material from the polarization switching seed layer pattern 635. The gate electrode layer 650 may be formed using, for example, chemical vapor deposition, atomic layer deposition, or sputtering.

Referring back to FIG. 13, an upper conductive layer 660 may be formed on the gate electrode layer 650. The upper conductive layer 660 may, for example, include a metal material. In an embodiment, the upper conductive layer 660 may have a lower electric resistance than the gate electrode layer 650. The upper conductive layer 660 may, for example, include copper (Cu), aluminum (Al), tungsten (W), or the like. The upper conductive layer 660 may be formed, for example, using chemical vapor deposition, atomic layer deposition, or sputtering.

Figure 14:
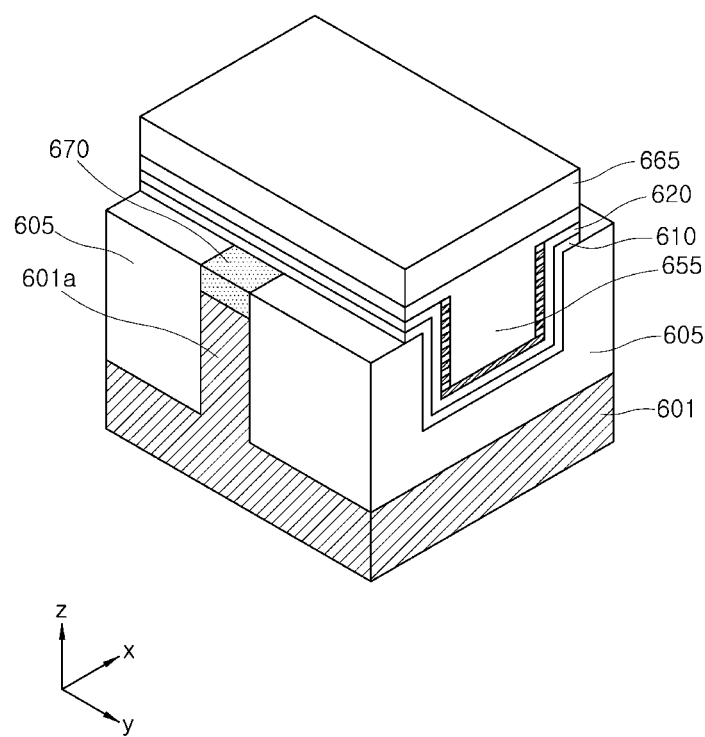

Referring to FIG. 14, the upper conductive layer 660 and the gate electrode layer 650 may be selectively etched to form an upper conductive layer 665 and a gate electrode layer 655. Next, a source region 670 and a drain region 680 that is shown in FIG. 6B may be formed by injecting impurities into the channel structure 6010 at both ends of the gate electrode layer 655 exposed by etching. In an embodiment, when the channel structure 6010 is doped with a p-type dopant, the source and drain regions 670 and 680 may be formed by selectively injecting an n-type dopant into the channel structure 6010. As an example of the dopant injecting method, an ion implantation process can be applied.

By performing the above-described processes, the ferroelectric memory device according to an embodiment of the present disclosure may be manufactured. The manufactured ferroelectric memory device may be substantially the same as the ferroelectric memory device 4 described above with reference to FIGS. 6A to 6C.

In some embodiments, the ferroelectric material layer 620 formed through the above-described manufacturing method in association with FIGS. 10, 10A and 10B may have an amorphous phase or a mixed phase of an amorphous phase and a crystalline phase, so that may not have sufficient ferroelectricity. Thus, after the polarization switching seed film 620 and the insulation film 640 are alternately stacked through the processes of FIGS. 11A and 11B, a crystallization heat treatment for the ferroelectric material layer 620 may be further performed. The ferroelectricity of the ferroelectric material layer 620 can be improved through the crystallization heat treatment. Alternately, the crystallization heat treatment for the ferroelectric material layer 620 may be performed before stacking the polarization switching seed film 630 and the insulation film 640 illustrated in FIGS. 11A and 11B.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A ferroelectric memory device comprising:
   a substrate;
   a ferroelectric material layer disposed on the substrate;
   a gate electrode layer disposed on the ferroelectric material layer; and
   a polarization switching seed layer disposed between the ferroelectric material layer and the gate electrode layer, wherein the polarization switching seed layer is a layer pattern with a predetermined cross-sectional area.

2. The ferroelectric memory device of claim 1, wherein the polarization switching seed layer is in contact with a portion of the ferroelectric material layer.

3. The ferroelectric memory device of claim 1, wherein the polarization switching seed layer comprises a conductive material.

4. The ferroelectric memory device of claim 3, wherein the polarization switching seed layer comprises at least one selected from the group consisting of tungsten (W), titanium (Ti), copper (Cu), aluminum (Al), platinum (Pt), iridium (Ir), ruthenium (Ru), tungsten nitride, titanium nitride, tantalum nitride, iridium oxide, ruthenium oxide, tungsten carbide, titanium carbide, tungsten silicide, titanium silicide, and tantalum silicide.

5. The ferroelectric memory device of claim 1, wherein the polarization switching seed layer has a cross-sectional area with a length and a width each measuring about 2 nm to about 10 nm.

6. The ferroelectric memory device of claim 1, wherein the ferroelectric material layer comprises at least one of hafnium oxide, zirconium oxide, and hafnium zirconium oxide.

7. The ferroelectric memory device of claim 1, further comprising:
   a source region and a drain region disposed in the substrate at both ends of the gate electrode layer.

8. A ferroelectric memory device comprising:
   a substrate;
   a ferroelectric material layer disposed on the substrate;
   a gate electrode layer disposed on the ferroelectric material layer; and
   a polarization switching seed layer disposed between the ferroelectric material layer and the gate electrode layer,
   wherein the polarization switching seed layer comprises a resistance change material layer including a conductive filament being formed in the resistance change material layer.

9. The ferroelectric memory device of claim 8, wherein the conductive filament has a diameter of about 2 nm to about 10 nm.

10. A ferroelectric memory device comprising:
    a substrate including a channel structure having a bottom surface and side surfaces;
    a ferroelectric material layer disposed on the bottom surface and the side surfaces of the channel structure;
    a polarization switching seed layer pattern and an insulating layer pattern on the ferroelectric material layer, the polarization switching seed layer pattern and the insulating layer pattern alternately stacked along the side surfaces of the channel structure; and
    a gate electrode layer electrically connected to the polarization switching seed layer pattern in the channel structure.

11. The ferroelectric memory device of claim 10, wherein the polarization switching seed layer pattern comprises at least one selected from the group consisting of tungsten (W), titanium (Ti), copper (Cu), aluminum (Al), platinum (Pt), iridium (Ir), ruthenium (Ru), tungsten nitride, titanium nitride, tantalum nitride, iridium oxide, ruthenium oxide, tungsten carbide, titanium carbide, tungsten silicide, titanium silicide, and tantalum silicide.

12. The ferroelectric memory device of claim 10, wherein the insulating layer pattern comprises at least one selected from the group consisting of silicon oxide, silicon nitride, silicon oxynitride, aluminum nitride, and aluminum oxide.

13. The ferroelectric memory device of claim 10, wherein the polarization switching seed layer pattern is a layer pattern of with a predetermined cross-sectional area on the ferroelectric material layer.

14. The ferroelectric memory device of claim 13, wherein the polarization switching seed layer has a cross-sectional area with a length and a width each measuring about 2 nm to about 10 nm.

* * * * *